(12) United States Patent
Kishino (10) Patent No.: US 11,133,436 B2
(45) Date of Patent: Sep. 28, 2021

(54) SEMICONDUCTOR LIGHT EMITTING ELEMENT

(71) Applicant: NICHIA CORPORATION, Anan (JP)

(72) Inventor: Toshihiko Kishino, Anan (JP)

(73) Assignee: NICHIA CORPORATION, Anan (JP)

( * ) Notice: Subject to any disclaimer, the term of this patent is extended or adjusted under 35 U.S.C. 154(b) by 33 days.

(21) Appl. No.: 16/561,310

(22) Filed: Sep. 5, 2019

(65) Prior Publication Data

US 2020/0105967 A1   Apr. 2, 2020

(30) Foreign Application Priority Data

Sep. 28, 2018  (JP) .............................. JP2018-183718

(51) Int. Cl.
| | |
|---|---|
| *H01L 33/00* | (2010.01) |
| *H01L 33/14* | (2010.01) |
| *H01L 33/38* | (2010.01) |
| *H01L 33/32* | (2010.01) |
| *H01L 33/04* | (2010.01) |

(52) U.S. Cl.
CPC .............. *H01L 33/14* (2013.01); *H01L 33/04* (2013.01); *H01L 33/325* (2013.01); *H01L 33/38* (2013.01)

(58) Field of Classification Search
CPC ....... H01L 33/04; H01L 33/14; H01L 33/325; H01L 33/38; H01L 33/00; H01L 33/32; H01L 33/20; H01L 33/36; H01L 33/40; H01L 33/42; H01L 33/62; H01L 33/648; H01L 31/028; H01L 31/0288; H01L 31/0312; H01L 31/03125; H01L 31/1804; H01L 31/1824; H01L 31/0296; H01L 31/02966; H01L 31/1828; H01L 31/032; H01L 31/1836; H01L 31/0327
USPC ......................................................... 257/13
See application file for complete search history.

(56) References Cited

U.S. PATENT DOCUMENTS

| | | | | |
|---|---|---|---|---|
| 5,340,998 A | * | 8/1994 | Kasahara ............ | H01L 33/0004 257/13 |
| 5,391,896 A | * | 2/1995 | Wanlass .............. | H01L 31/0687 257/440 |
| 2005/0040432 A1 | * | 2/2005 | Feng ................... | H01L 33/0016 257/198 |

(Continued)

FOREIGN PATENT DOCUMENTS

| | | |
|---|---|---|
| WO | WO-2011/035265 A1 | 3/2011 |
| WO | WO-2017/136832 A1 | 8/2017 |

OTHER PUBLICATIONS

L. Riuttanen, P. Kivisaari, O. Svensk, J. Oksanen, and S. Suihkonen, Appl. Phys. Lett. 107, May 11, 2006,(2015) (Year: 2015).*

(Continued)

*Primary Examiner* — Chuong A Luu
(74) *Attorney, Agent, or Firm* — Foley & Lardner LLP (57) ABSTRACT

A light emitting element includes: a first conductivity type semiconductor layer; a second conductivity type semiconductor layer disposed over the first conductivity type semiconductor layer; a first electrode and a second electrode disposed over the second conductivity type semiconductor layer and spaced apart from each other; and a light emitting layer disposed over the second conductivity type semiconductor layer and, in a top view, positioned between the first electrode and the second electrode.

20 Claims, 7 Drawing Sheets

(56) References Cited

U.S. PATENT DOCUMENTS

| | | | | |
|---|---|---|---|---|
| 2005/0054172 | A1* | 3/2005 | Feng | H01L 29/155 438/313 |
| 2008/0219310 | A1* | 9/2008 | Shveykin | H01S 5/32341 372/45.01 |
| 2010/0078623 | A1* | 4/2010 | Feng | H01L 33/0016 257/13 |
| 2010/0240162 | A1* | 9/2010 | Bae | H01L 33/14 438/47 |
| 2010/0258826 | A1* | 10/2010 | Takeuchi | H01L 33/38 257/94 |
| 2010/0289427 | A1* | 11/2010 | Walter | H01S 5/06203 315/291 |
| 2011/0204376 | A1* | 8/2011 | Su | H01L 27/156 257/76 |
| 2012/0025230 | A1* | 2/2012 | Yan | H01L 27/153 257/93 |

OTHER PUBLICATIONS

Kim I, Kivisaari P, Oksanen J, Suihkonen S;Diffusion-Driven Charge Transport in Light Emitting Devices;Materials (Basel, Switzerland), 10(12), Dec. 11, 2017 (Year: 2017).*

L. Riuttanen et al., "Electrical injection to contactless near surface InGaN quantum well", Applied Physics Letters, vol. 107, May 11, 2006 (2015).

* cited by examiner

SEMICONDUCTOR LIGHT EMITTING ELEMENT

CROSS-REFERENCE TO RELATED APPLICATIONS

The present application is based on and claims priority of Japanese patent application No. 2018-183718, filed on Sep. 28, 2018, the contents of which are hereby incorporated by reference in their entirety.

BACKGROUND

The present disclosure relates to a light emitting element, and more specifically, to a light emitting element that has a semiconductor multilayer structure.

Semiconductor light emitting elements, such as light emitting diodes (LEDs), are widely used as miniaturized light sources that consume little energy and have long lifespans. A conventional semiconductor light emitting element has a multilayer structure that includes a light emitting layer between a p-type semiconductor layer and an n-type semiconductor layer. In recent years, another type of semiconductor light emitting element with a multilayer structure different from the conventional semiconductor light emitting element has been studied. For example, L. Riuttanen et al., "Electrical injection to contactless near-surface InGaN quantum well", Applied Physics Letters 107, 051160 (2015) (hereinafter "Riuttanen") describes a surface LED (S-LED) that includes a p-type GaN layer, an n-type GaN layer and a surface quantum-well layer (surface QW) as a light emitting layer, which are stacked one on top of the other in this order. According to Riuttanen, the S-LED emits light by causing a current to flow from the p-type GaN layer to the n-type GaN layer. However, at this time, a drift current does not flow to the surface QW. In the technique mentioned in Riuttanen, the surface QW emits light by a diffusion current that is generated due to bipolar carrier diffusion from the pn-homojunction between the n-type GaN layer and the p-type GaN layer.

SUMMARY

LEDs have rectifying characteristics and thus do not emit light when a reverse voltage is applied thereto. For this reason, when connected to an AC power source, the LED flashes repeatedly and thereby cannot continuously emit light. To continuously emit light from a semiconductor light emitting element, a conversion circuit, such as a DC/AC converter that converts an AC current into a DC current, is required, which makes a current-carrying circuit complicated. Thus, a semiconductor light emitting element that can be connected to an AC power source without a converter is desired.

Therefore, it is an object of the present disclosure to provide a light emitting element that can emit light continuously without requiring any converter or the like while being connected to an AC power source.

A light emitting element according to an embodiment of the present disclosure includes: a first conductivity type semiconductor layer; a second conductivity type semiconductor layer disposed over the first conductivity type semiconductor layer; a first electrode and a second electrode disposed over the second conductivity type semiconductor layer and spaced apart from each other; and a light emitting layer disposed over the second conductivity type semiconductor layer and, in a top view, positioned between the first electrode and the second electrode.

The light emitting element described above can emit light continuously without requiring any converter or the like while being connected to an AC power source.

DETAILED DESCRIPTION

Embodiments of the present invention will be described in detail below with reference to the accompanying drawings. In the description below, terms indicative of directions or positions (e.g., "upper", "lower", "right", "left" and other words including these words) are used as appropriate. The use of these terms is to make the understanding of the present invention easy with reference to the drawings, and does not limit the technical range of the present invention by their meanings. The same reference characters represented in the drawings indicate the same portions or members.

Embodiments

Figure 1:
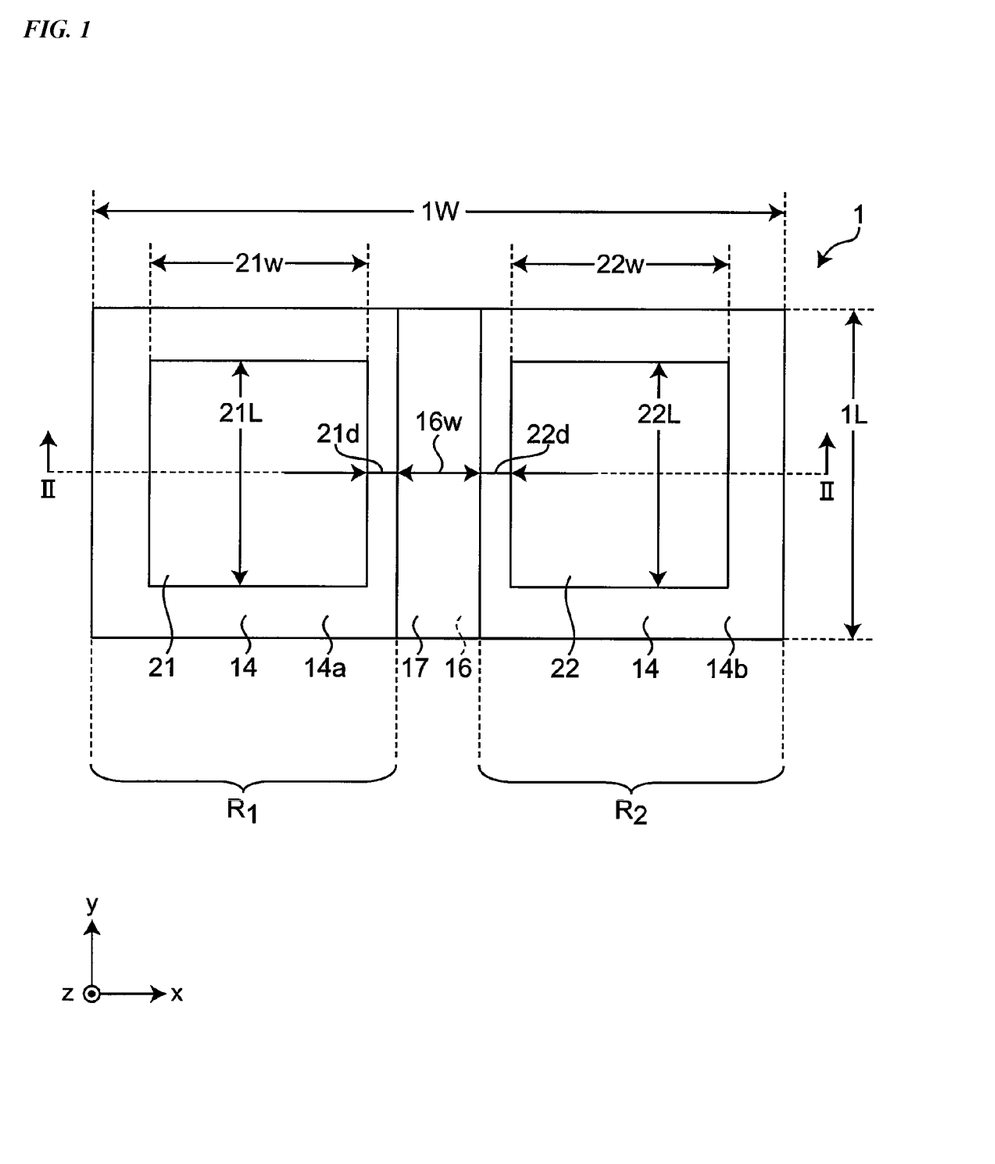
FIG. 1 is a schematic top view of a light emitting element according to an embodiment of the present invention.
Figure 2:
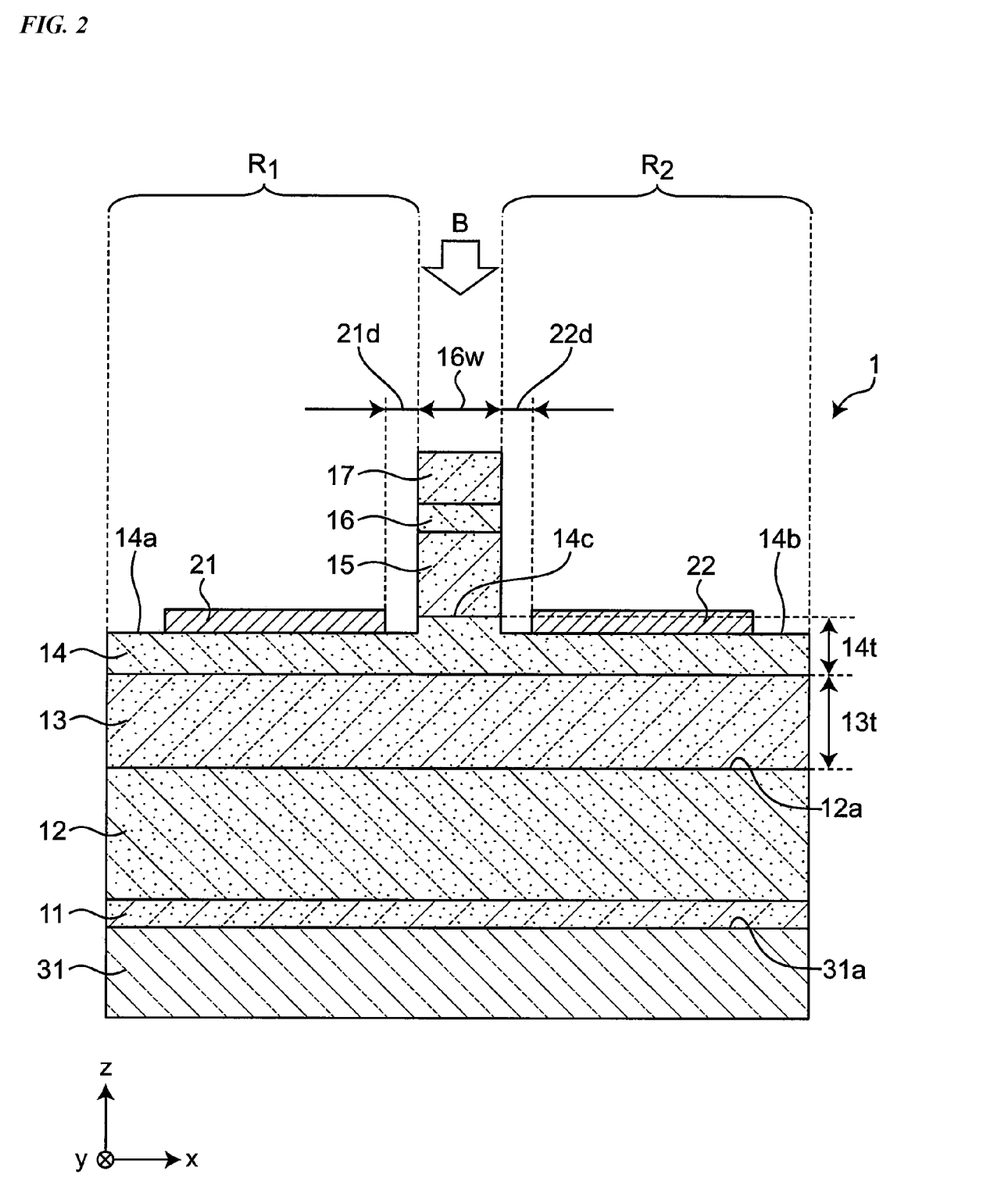
FIG. 2 is a schematic cross-sectional view taken along the line II-II of FIG. 1.

FIG. 1 is a schematic top view of a light emitting element 1 according to an embodiment of the present invention, and FIG. 2 is a schematic cross-sectional view taken along the line II-II of FIG. 1.

The light emitting element 1 according to the present embodiment includes a first conductivity type semiconductor layer 13 on an upper surface 31a side of a substrate 31, a second conductivity type semiconductor layer 14 on the upper side of the first conductivity type semiconductor layer 13, and first and second electrodes 21 and 22 on parts of the upper surface (electrode formation surfaces 14a and 14b) of the second conductivity type semiconductor layer 14. The first electrode 21 and the second electrode 22 are spaced apart from each other. The light emitting element 1 further includes a light emitting layer 16 on a part of the upper surface of the second conductivity type semiconductor layer 14 (light emitting layer formation surface 14c), excluding the electrode formation surfaces 14a and 14b. As shown in FIG. 2, the electrode formation surfaces 14a and 14b of the second conductivity type semiconductor layer 14 are provided at positions lower than the light emitting layer formation, surface 14c of the second conductivity type semiconductor layer 14. However, these surfaces 14a, 14b and 14c may be flush with one another.

The light emitting layer 16 is disposed between the first electrode 21 and the second electrode 22 in the top view (when viewed from the direction indicated by the arrow B in FIG. 2, i.e., in the top view shown in FIG. 1). No electrode is formed above the light emitting layer 16.

As shown in FIG. 2, the light emitting element 1 may also include a buffer layer 11 and an underlayer 12 between the substrate 31 and the first conductivity type semiconductor layer 13. The light emitting element 1 may also include a superlattice layer 15 between the second conductivity type semiconductor layer 14 and the light emitting layer 16. Further, the light emitting element 1 may include a cap layer 17 on the top side of the light emitting layer 16.

Figure 3A:
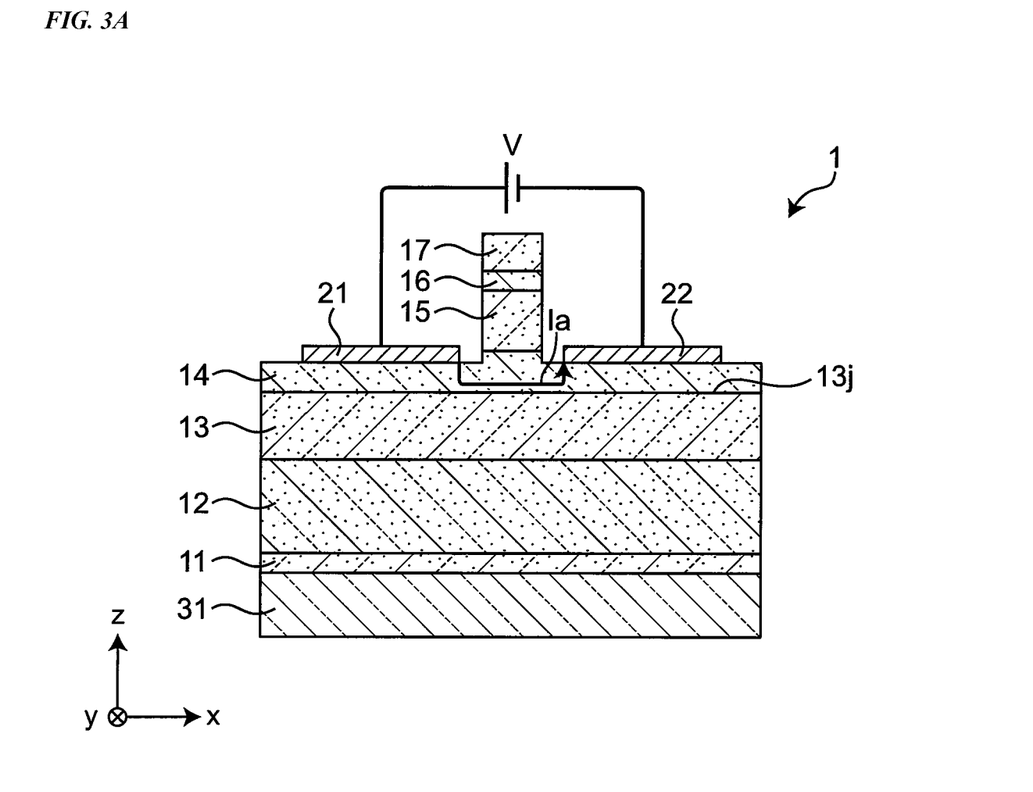
FIG. 3A is a schematic cross-sectional view showing a state in which a voltage is applied to the light emitting element according to the embodiment.

To emit light from the light emitting element 1, a voltage is applied between the first electrode 21 and the second electrode 22. For example, as shown in FIG. 3A, a positive electrode of an external power source V is connected to the first electrode 21, while a negative electrode of the external power source V is connected to the second electrode 22. As a result, a current Ia (drift current) flows from the first electrode 21 to the second electrode 22 through the second conductivity type semiconductor layer 14. The current Ia (drift current) may not pass through the light emitting layer 16, just like how it does not pass through the surface LED (S-LED) mentioned in Riuttanen, but the light emitting layer 16 still emits light.

Figure 3B:
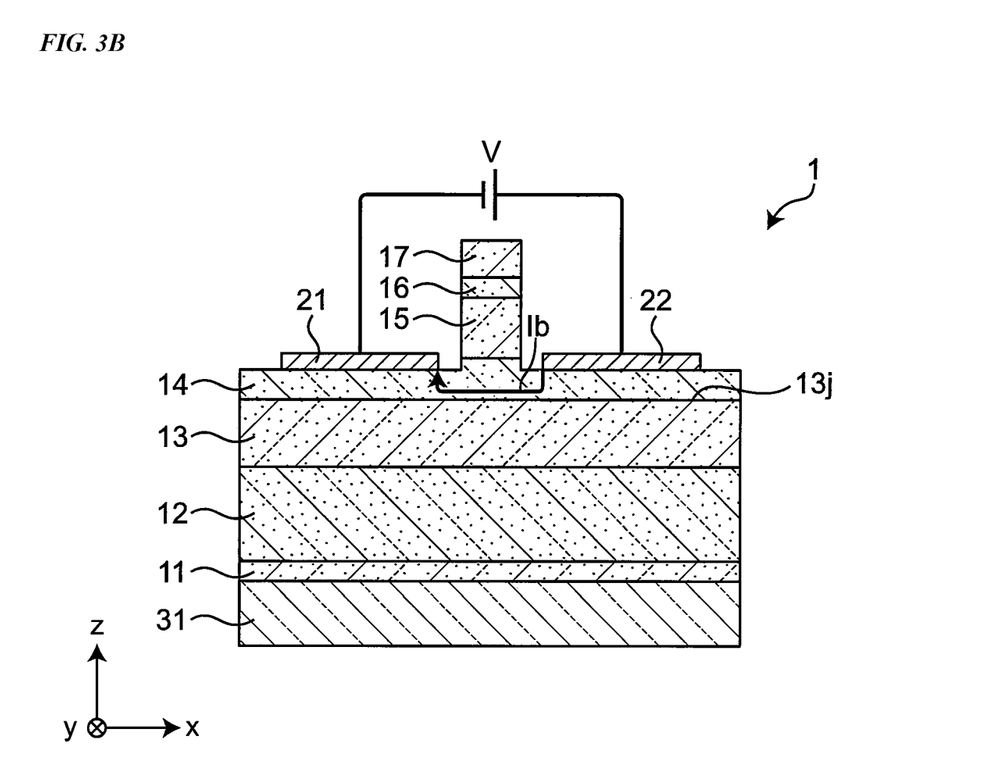
FIG. 3B is a schematic cross-sectional view showing a state in which a voltage is applied to the light emitting element according to the embodiment.

However, in the light emitting element 1, the current Ia can flow from the first electrode 21 to the second electrode 22 without also passing through a junction surface 13j of the junction (PN junction) between the first conductivity type semiconductor layer 13 and the second conductivity type semiconductor layer 14, unlike the surface LED (S-LED) mentioned in Riuttanen. Thus, the light emitting element 1 does not exhibit rectifying characteristics. As shown in FIG. 3B, the light emitting element 1 can emit light, even when the negative electrode of the external power source V is connected to the first electrode 21, while the positive electrode of the external power source V is connected to the second electrode 22.

In this way, the light emitting element 1 according to the present embodiment does not exhibit rectifying characteristics, so that the light emitting element 1 can continuously emit light while being connected to an AC power source, regardless of which electrode is an anode or a cathode.

Conventional LEDs exhibit rectifying characteristics. Because of this, the voltage application directions to the LED include the forward direction and the reverse direction. If the reverse voltage is applied, the LED easily breaks down. However, the light emitting element 1 according to the embodiment does not exhibit the rectifying characteristics and thus does not need the discrimination between the forward and reverse applied voltages. That is, the element breakdown due to the reverse voltage does not occur. Therefore, unlike the conventional LEDs, the light emitting element 1 of the present embodiment can avoid the element breakdown due to an error in connection to a power source.

In the light emitting element according to the present embodiment, the current neither passes through the light emitting layer 16 nor the junction surface 13j (PN junction). The principle of light emission by the light emitting layer 16 is not clear, but it is presumed that this light emission is based on the following mechanism. For easy understanding, the description below will be given assuming that the first conductivity type semiconductor layer 13 is a p-type semiconductor layer and the second conductivity type semiconductor layer 14 is an n-type semiconductor layer.

The second conductivity type semiconductor layer (n-type semiconductor layer) 14 is depleted by an Mg memory effect or PN junction in the vicinity of the junction surface 13j between the first conductivity type semiconductor layer (p-type semiconductor layer) 13 and the second conductivity type semiconductor layer (n-type semiconductor layer) 14. When a current flows through the second conductivity type semiconductor layer (n-type semiconductor layer) 14 by applying a voltage between the electrodes, a current path is formed to allow the current to flow through the light emitting layer 16 provided above the second conductivity type semiconductor layer (n-type semiconductor layer) 14. As the main carriers in the second conductivity type semiconductor layer (n-type semiconductor layer) 14 are electrons, it is presumed that the electrons are supplied to the light emitting layer 16 by the drift current or diffusion current passing through such a current path. Meanwhile, as the first conductivity type semiconductor layer 13 (p-type semiconductor layer) serving as a supply source is spaced away from the electrodes, it is also presumed that the holes are supplied to the light emitting layer 16 by carrier diffusion. Thus, the holes and the electrons are considered to be recombined together to emit light in the light emitting layer 16.

The first conductivity type semiconductor layer 13, the second conductivity type semiconductor layer 14, and the light emitting layer 16 may be formed of nitride semiconductors. That is, the light emitting element 1 may be a nitride semiconductor light emitting element. For the nitride semiconductor light emitting element, the light emitting element 16 is formed of, for example, an InGaN layer, and thus can change its emission wavelength by changing a composition ratio of In in the InGaN layer.

In a typical nitride semiconductor light emitting element, a p-type nitride semiconductor layer is stacked on the light emitting layer. In such a structure, when the crystallinity of the light emitting layer is deteriorated, the crystallinity of the p-type nitride semiconductor layer stacked thereon is also deteriorated. When the light emitting layer is made of a compound of a ternary or higher compound, such as InGaN, rather than GaN, the crystallinity of the light emitting layer tends to deteriorate as the composition ratio of In or the like increases. For example, when considering the crystallinity of the p-type nitride semiconductor layer, it is difficult to increase the In composition ratio in order to make the emission wavelength longer.

In contrast, the light emitting element 1 of the present embodiment does not have a configuration in which the light emitting layer 16 is sandwiched between semiconductor layers of different conductivity types, but has a configuration in which the light emitting layer 16 is stacked over the first conductivity type semiconductor layer 13 and the second conductivity type semiconductor layer 14. Therefore, the composition of the light emitting layer 16 can be determined without the need to consider the crystallinity of the first conductivity type semiconductor layer 13 and the second conductivity type semiconductor layer 14. Thus, the emission wavelength of the light emitting element 1 can be selected from a wider range of wavelengths.

In addition, the growth temperature of the p-type nitride semiconductor layer tends to be higher than the growth temperature of the light emitting layer. In the above-mentioned conventional configuration, the light emitting layer is susceptible to damage due to heat during the growth of the p-type nitride semiconductor layer. When the light emitting layer has such heat damage, the crystallinity of the light emitting layer deteriorates due to, for example, a decrease in the In composition ratio of the InGaN layer. The light emitting element 1 of the present embodiment is free from such a concern. Thus, the emission wavelength of the light emitting element 1 can be selected from a wider range of wavelengths.

Hereinafter, the description will be given on a preferable embodiment in which the light emitting element 1 is a nitride semiconductor light emitting element.

As mentioned above, the light emitting element 1 may include the substrate 31, and the underlayer 12 disposed on the upper surface 31a side of the substrate 31 (see FIG. 2). For a nitride light emitting element, the underlayer 12 may be, for example, an undoped nitride semiconductor layer. In this case, the first conductivity type semiconductor layer 13 is formed on the upper surface 12a of the underlayer (undoped nitride semiconductor layer). Because the undoped layer has better crystallinity than the impurity-doped layer, an undoped layer is suitable as the underlayer 12.

Furthermore, the buffer layer 11 may be included between the substrate 31 and the underlayer 12.

The first conductivity type semiconductor layer 13 and the second conductivity type semiconductor layer 14 can be either a p-type nitride semiconductor layer or an n-type nitride semiconductor layer, but preferably, the first conductivity type semiconductor layer 13 is a p-type nitride semiconductor layer, and the second conductivity type semiconductor layer 14 is an n-type nitride semiconductor layer. The current is less likely to spread in the p-type nitride semiconductor layer than in the n-type nitride semiconductor layer. This is because the activation rate of carriers (holes) in the p-type nitride semiconductor layer is low, resulting in a relatively low carrier concentration therein. To inject more carriers into the light emitting layer 16, an n-type nitride semiconductor layer where a current easily spreads is preferably disposed at a position close to the light emitting layer 16. That is, the first conductivity type semiconductor layer 13 located on the lower side is formed as the p-type nitride semiconductor layer, while the upper second conductivity type semiconductor layer 14 located on the upper side is formed as the n-type nitride semiconductor layer, so that the efficiency of carrier supply to the light emitting layer 16 can be improved.

The second conductivity type semiconductor layer 14 preferably has a thickness of 200 to 500 nm. A depletion layer is formed in the second conductivity type semiconductor layer 14. When the thickness of the second conductivity type semiconductor layer 14 is set to 200 to 500 nm, the thickness of the depletion layer can be controlled to a particularly preferable thickness.

When the thickness of the second conductivity type semiconductor layer 14 is 200 nm or more, the depletion layer can be formed to have an appropriate thickness, thereby suppressing tunneling or leakage of carriers. As will be described later, to form the electrode formation surfaces 14a and 14b, a part of the second conductivity type semiconductor layer 14 may be removed in the thickness direction. In addition, when the thickness of the second conductivity type semiconductor layer 14 is 200 nm or more, such a partial removal step becomes easy.

Meanwhile, when the thickness of the second conductivity type semiconductor layer 14 is 500 nm or less, the second conductivity type semiconductor layer 14 can be filled substantially completely with the depletion layer. This makes it easier for a current to flow to the light emitting layer 16, improving the luminous efficiency.

Thus, the thickness of the second conductivity type semiconductor layer 14 is more preferably in the range of 300 to 500 nm, and particularly preferably 350 to 500 nm.

The first conductivity type semiconductor layer 13 preferably has a thickness of 0.1 to 1.5 µm. Because the first conductivity type semiconductor layer 13 is separated from the light emitting layer 16, the thickness of the first conductivity type semiconductor layer 13 is preferably relatively high, and specifically, is in a range of 0.1 to 1.5 µm so as to sufficiently supply carriers from the first conductivity type semiconductor layer 13 to the light emitting layer 16.

In particular, when the first conductivity type semiconductor layer 13 is a p-type nitride semiconductor layer, preferably, for example, the concentration of the p-type dopant (Mg or the like) is set lower than a typical concentration thereof, and instead the first conductivity type semiconductor layer 13 is made thicker. For example, the concentration of Mg in the first conductivity type semiconductor layer 13 may be set to $1 \times 10^{17}$ to $1 \times 10^{18}/cm^3$, and the thickness of the first conductivity type semiconductor layer 13 may be 1 µm or more. This makes it possible to supply a sufficient amount of holes while improving the crystallinity of the p-type nitride semiconductor.

In the top view as shown in FIG. 1, each of the first distance 21d between the first electrode 21 and the light emitting layer 16 and the second distance 22d between the second electrode 22 and the light emitting layer 16 is preferably in the range of 1 to 4 µm. As used herein, the term "first distance 21d" refers to the shortest distance between the first electrode 21 and the light emitting layer 16 in the top view, whereas the term "second distance 22d" refers to the shortest distance between the second electrode 22 and the light emitting layer 16.

When each of the first and second distances 21d and 22d is 1 µm or more, possibility of short-circuiting between the first and second electrodes 21 and 22 and the light emitting layer 16 can be reduced. When each of the first and second distances 21d and 22d is 4 µm or less, the efficiency of current injection from the first electrode 21 or second electrode 22 into the light emitting layer 16 can be improved.

Each of the first distance 21d and the second distance 22d is more preferably in the range of 2 to 4 µm. The first distance 21d and the second distance 22d may be the same as or different from each other.

As shown in FIG. 1, the dimension 16w of the light emitting layer 16 in the direction of separation between the first electrode 21 and the second electrode 22 is preferably in the range of 1 to 30 µm. When the above-mentioned dimension is 1 µm or more, a sufficient light emission region can be secured. When the above-mentioned dimension is 30 µm or less, the voltage required to emit light can be appropriately reduced.

As used herein, the expression "direction of separation between the first electrode 21 and the second electrode 22" refers to a direction in which a distance between the first electrode 21 and the second electrode 22 is shortest. The expression "dimension 16w of the light emitting layer 16 in the direction of separation" means the dimension of the light emitting layer 16 measured along the direction of separation. It should be noted that as the direction of separation may vary depending on the arrangement of the first electrode 21 and the second electrode 22, the dimension 16w of the light emitting layer 16 in the direction of separation may also vary depending on the arrangement of the first electrode 21 and the second electrode 22.

For example, in the light emitting element 1 shown in FIG. 1, the direction in which the first electrode 21 and the second electrode 22 are connected to have the shortest distance therebetween (the direction along the line II-II) is the direction (x direction) that is orthogonal to the longitudinal direction (y direction) of the light emitting layer 16. That is, the expression "direction of separation between the first electrode 21 and the second electrode 22" coincides with the x direction. Thus, the dimension 16w of the light emitting layer 16 is the dimension of the light emitting layer 16 in the x direction (the width of the light emitting layer 16).

Figure 4:
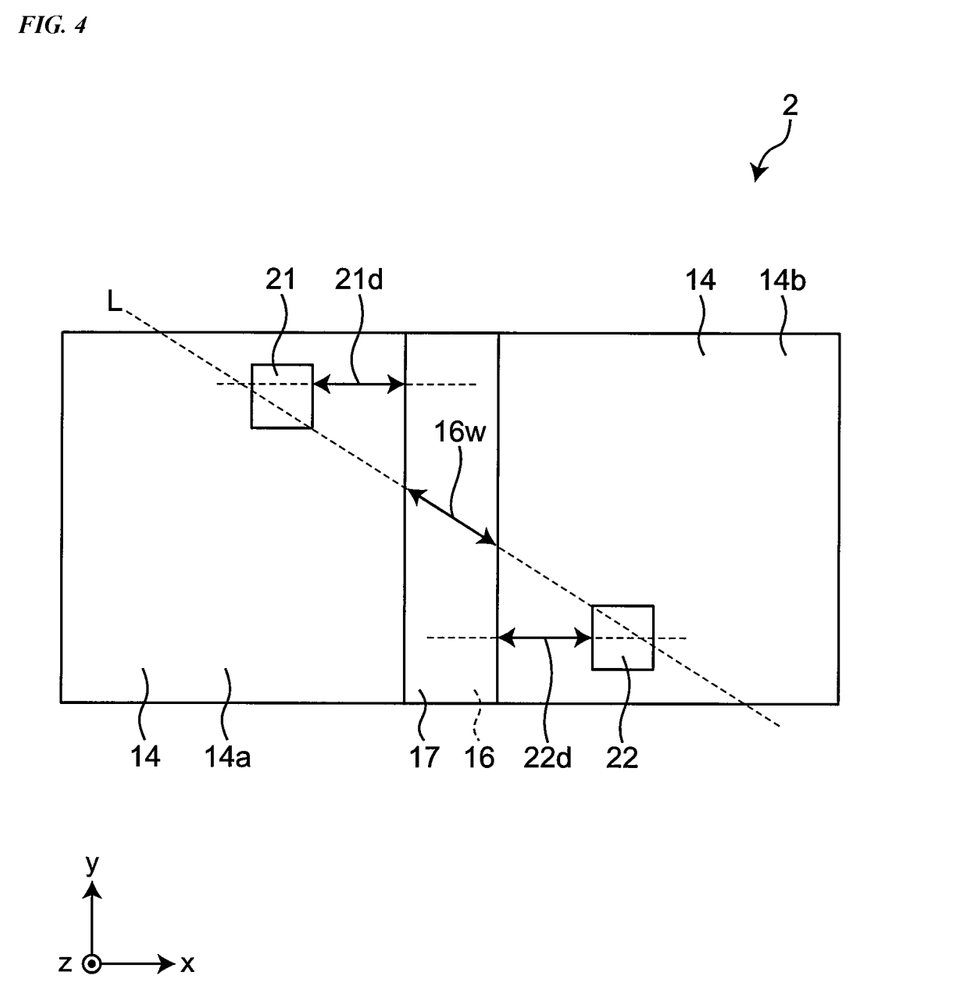
FIG. 4 is a schematic top view of a modification of the light emitting element according to the embodiment.

On the other hand, in a modification shown in FIG. 4 (light emitting element 2), the direction in which the first electrode 21 and the second electrode 22 are connected to have the shortest distance therebetween is the direction along the straight line L that connects the first electrode 21 and the second electrode 22 at the shortest distance. That is, the expression "direction of separation between the first electrode 21 and the second electrode 22" coincides with the extending direction of the straight line L. Thus, the dimension 16w of the light emitting layer 16 is the dimension of the light emitting layer 16 in the extending direction of the straight line L.

As can be seen from FIGS. 1 and 4, the dimension 16w of the light emitting layer 16 may coincide with the width of the light emitting layer 16 or may be larger than the width of the light emitting layer 16, depending on the arrangement of the first electrode 21 and the second electrode 22.

In the light emitting element 2 shown in FIG. 4, in the top view, the first distance 21d between the first electrode 21 and the light emitting layer 16 and the second distance 22d between the second electrode 22 and the light emitting layer 16 are not related to the straight line L that connects the first electrode 21 and the second electrode 22 at the shortest distance. As mentioned above, the term "first distance 21d" is the shortest distance between the first electrode 21 and the light emitting layer 16, while the term "second distance 22d" is the shortest distance between the second electrode 22 and the light emitting layer 16. Thus, in FIG. 4, the first distance 21d is the distance between the first electrode 21 and the light emitting layer 16 in the x direction, and the second distance 22d is the distance between the second electrode 22 and the light emitting layer 16 in the x direction.

As shown in FIG. 2, the cap layer 17 may be provided over the light emitting layer 16 so as to protect the light emitting layer 16. The cap layer 17 may be formed of an undoped nitride semiconductor.

As shown in FIG. 2, the superlattice layer 15 may be provided between the second conductivity type semiconductor layer 14 and the light emitting layer 16. By providing the superlattice layer 15 in this position, the luminous efficiency of the light emitting layer 16 stacked thereon can be improved.

Each component of the light emitting element 1 of the present embodiment will be described below.
(Substrate 31)

The substrate 31 may employ any one of an insulating substrate, a semiconductor substrate and a conductive substrate.

When the first conductivity type semiconductor layer 13, the second conductivity type semiconductor layer 14 and the light emitting layer 16 are made of nitride semiconductors, the substrate 31 may employ an insulating substrate made of sapphire or the like (with any one of the C-plane, the R-plane and the A-plane as the main surface), or a conductive substrate made of SiC (including 6H—SiC, 4H—SiC and 3C—SiC), Si, or the like. For example, a sapphire substrate can be used as the substrate 31. The substrate 31 may be finally removed or may not be removed.

The main surface (semiconductor growth surface) of the sapphire substrate may have a plurality of projections, each having a triangular pyramid shape or the like, in order to improve light extraction efficiency.
<Semiconductor Layers>

The light emitting element 1 includes the first conductivity type semiconductor layer 13, the second conductivity type semiconductor layer 14 and the light emitting layer 16 as the semiconductor layers. The light emitting element 1 may further include semiconductor layers, such as the buffer layer 11, the underlayer 12, the superlattice layer 15 and the cap layer 17.

Examples of semiconductors constituting the semiconductor layers include nitride semiconductors, such as GaN-based semiconductors, as well as GaAs-based semiconductors, SiC-based semiconductors and ZeSe-based semiconductors. The semiconductor layer can be formed of, for example, a nitride semiconductor. Examples of the nitride semiconductor include a GaN-based semiconductor ($In_XAl_YGa_{1-X-Y}N$ ($0 \leq X$, $0 \leq Y$, $X+Y \leq 1$)). The term "nitride semiconductor" as used herein also includes a mixed crystal in which at least a part of at least one element of a nitride semiconductor is substituted. These nitride semiconductor layers are formed by being doped with n-type or p-type impurities or are formed undoped, depending on the application of each layer.

The semiconducting layers can be formed by known techniques, such as metal-organic chemical vapor deposition (MOCVD), hydride vapor phase epitaxy (HVPE), molecular beam epitaxy (MBE), and the like.

The respective semiconductor layers wall be described in detail below.
(First Conductivity Type Semiconductor Layer 13)

The first conductivity type semiconductor layer 13 may be a p-type nitride semiconductor layer. The p-type nitride semiconductor layer can be formed of, for example, Mg-doped GaN. The doping amount of Mg is in the range of, for example, $1 \times 10^{17}$ to $1 \times 10^{20}/cm^3$. Specifically, when forming the p-type nitride semiconductor layer with a thickness of 1 µm or more, the doping amount of Mg is preferably in the range of $1 \times 10^{17}$ to $1 \times 10^{18}/cm^3$. A p-type impurity other than Mg may be used.

As mentioned above, the thickness of the first conductivity type semiconductor layer 13 is preferably 0.1 to 1.5 µm.
(Second Conductivity Type Semiconductor Layer 14)

The second conductivity type semiconductor layer 14 may be an n-type nitride semiconductor layer. The n-type nitride semiconductor layer can be formed of, for example, Si-doped GaN or undoped GaN. When the n-type nitride semiconductor layer is doped with Si, the doping amount of Si is preferably $1 \times 10^{18}$ to $1 \times 10^{20}/cm^3$. An n-type impurity other than Si may be used.

As mentioned above, the thickness of the second conductivity type semiconductor layer 14 is preferably in the range of 200 to 500 nm, more preferably 300 to 500 nm, and particularly preferably 350 to 500 nm.
(Light Emitting Layer 16)

The light emitting layer 16 may be a nitride semiconductor layer made of InGaN, GaN, AlGaN, or the like, thereby making it possible to produce the light emitting element 1 that is capable of emitting light in the range from the ultraviolet region to visible light (red light) region with high luminous efficiency. The light emitting layer 16 may have a quantum well structure. For example, the light emitting layer 16 may be formed by a single quantum well structure or a multilayer quantum well structure, in which a barrier layer made of GaN and a well layer made of $In_xGa_{1-x}N$ are stacked one on top of the other.

The emission wavelength of the light emitting layer can be changed by adjusting the band gap energy of the well layer. Because the light emitting layer 16 is provided over the first conductivity type semiconductor layer 13 and the second conductivity type semiconductor layer 14, as mentioned above, an In-containing nitride semiconductor layer that has a relatively large In composition ratio is easily grown as the well layer. For example, the well layer made of $In_xGa_{1-x}N$ can be grown to have an In composition ratio ("x" of the composition equation $In_xGa_{1-x}N$ ranging from 30 to 50% (x=0.30 to 0.50).

(Buffer Layer 11, Underlayer 12)

The buffer layer 11 and the underlayer 12 are formed between the substrate 31 and the first conductivity type semiconductor layer 13. The buffer layer 11 can be formed of, for example, an AlGaN layer of 10 to 20 nm in thickness. The underlayer 12 may be formed of, for example, an undoped nitride semiconductor layer of 1 to 10 μm in thickness.

(Superlattice Layer 15)

The superlattice layer 15 is a layer for increasing the luminous efficiency of the light emitting layer 16, and is formed under the light emitting layer 16. The superlattice layer 15 can be formed, for example, by alternately stacking first layers made of GaN and second layers made of InGaN. For example, 5 to 30 pairs of the first and second layers can be stacked one on top of the other. For example, the thickness of each of the first layer ranges from 1 to 2 nm, while the thickness of each of the second layers ranges from 2 to 4 nm. The total thickness of the superlattice layer 15 ranges, for example, from 15 to 180 nm.

(Cap Layer 17)

The cap layer 17 is a layer for protecting the light emitting layer 16, and is formed over the light emitting layer 16. The cap layer 17 can be formed of, for example, a GaN layer of 5 to 15 mm in thickness.

(First Electrode 21, Second Electrode 22)

The first electrode 21 and the second electrode 22 can be formed of one or more materials selected from metals, such as Ti, Al and Au, and conductive oxides, such as an indium tin oxide (ITO). For example, each of the first and second electrodes 21 and 22 can be formed from a multilayer metal film that includes a lamination of a Ti film and an Al film. In order to emit light in the same manner regardless of the direction in which the current flows between these electrodes, the first electrode 21 and the second electrode 22 are preferably formed of the same material. The first electrode 21 and the second electrode 22 can be formed at positions that do not overlap with the light emitting layer 16 in the top view. Thus, the first electrode 21 and the second electrode 22 can be made of an appropriate material selected from materials having good conductivity without considering the light transmitting properties or light absorbing properties for the light emitted from the light emitting layer 16. The first electrode 21 and the second electrode 22 can be formed by a film forming method, such as a sputtering method.

EXAMPLES

A light emitting element in an Example was fabricated in the following ways.

(Substrate 31)

A substrate with a thickness of 850 μm, made of sapphire (main surface: C-plane), was used as the substrate 31. The surface of the substrate was cleaned at 1,050° C. under a hydrogen atmosphere in a MOCVD reactor.

(Buffer Layer 11)

The buffer layer 11 with a thickness of approximately 18 nm, made of AlGaN, was grown on the substrate at a temperature of 550° C. using TMA, TMG and ammonia as source gas.

(Underlayer 12)

The underlayer 12 was formed of a first underlayer and a second underlayer.

The first underlayer 12 made of a GaN layer with a thickness of approximately 1.5 μm was grown on the substrate 31 at a temperature of 1,050° C. using TMG and ammonia as source gas.

Subsequently, the second underlayer 12 made of a GaN layer with a thickness of approximately 1.5 μm was grown on the first underlayer at a temperature of 1,150° C. using TMG and ammonia as source gas.

In this way, the underlayer 12 with a thickness of approximately 3 μm was formed.

(First Conductivity Type Semiconductor Layer 13)

Subsequently, the first conductivity type semiconductor layer 13 (p-type nitride semiconductor layer) with a thickness of 1.3 μm, made of GaN doped with Mg at a doping amount of $2 \times 10^{17}/cm^3$, was grown on the underlayer 12 at a temperature of 840° C. using TMG, ammonia and $Cp_2Mg$.

(Second Conductivity Type Semiconductor Layer 14)

Then, the second conductivity type semiconductor layer 14 (n-type nitride semiconductor layer) with a thickness of 250 nm, made of n-type GaN doped with Si at a doping amount of $1 \times 10^{18}/cm^3$, was grown on the first conductivity type semiconductor layer 13 at 1,150° C. using TMG, ammonia and monosilane.

(Superlattice Layer 15)

Then, GaN layers each having a thickness of 2 nm, and $In_{0.05}Ga_{0.95}N$ layers each having a thickness of 1 nm were alternately grown on the second conductivity type semiconductor layer 14 at a temperature of 860° C. using TEG, TMI and ammonia as source gas to form five pairs of GaN and $In_{0.05}Ga_{0.95}N$ layers. Finally, a GaN layer with a thickness of 2 nm was grown on the five pairs of layers to thereby form the superlattice layer 15.

(Light Emitting Layer 16)

Then, the light emitting layer 16 (single well layer) with a thickness of 3.5 nm, made of $In_{0.13}Ga_{0.87}N$, was grown on the superlattice layer 15 at a temperature of 840° C. by using TEG, TMI and ammonia as source gas.

(Cap Layer 17)

Subsequently, the cap layer 17 made of a GaN layer with a thickness of approximately 10 nm was grown over the substrate at a temperature of 840° C. by using TMG and ammonia as source gas.

Thereafter, partial regions of the cap layer 17, the light emitting layer 16 and the superlattice layer 15 were removed to expose the second conductivity type semiconductor layer 14. At this time, the positions and ranges of the removed regions $R_1$ and $R_2$ (denoted by reference characters $R_1$ and $R_2$ in FIGS. 1 and 2) were determined such that the removed regions $R_1$ and $R_2$ were located at two positions and on both sides of the remaining light emitting layer 16 in the top view. Furthermore, simultaneously, part (of about 70 to 90 nm) in the thickness direction of the second conductivity type semiconductor layer 14 was also removed. The electrode formation surfaces 14a and 14b are defined as the surfaces of the second conductivity type semiconductor layer 14 that are slightly recessed with respect to the light emitting layer formation surface 14c.

Finally, the first electrode 21 and the second electrode 22 were formed on the electrode formation surfaces 14a and 14b, respectively. An ITO layer with a thickness of 60 nm was formed by the sputtering method to form the first and second electrodes 21 and 22.

The dimensions of the respective components of the obtained light emitting element 1 (FIGS. 1 and 2) were as follows.

The light emitting element 1 has a width 1W of approximately 500 μm.

The light emitting element 1 has a length 1L of approximately 250 μm.

The dimension 16w of the light emitting layer 16 in the direction of separation between the first electrode 21 and the second electrode 22 is 30 μm.

Each of the width 21w of the first electrode 21 and the width 22w of the second electrode 22 is 220 μm.

Each of the length 21L of the first electrode 21 and the length 22L of the second electrode 22 is 230 μm.

Each of the first distance 21d between the first electrode 21 and the light emitting layer 16 and the second distance 22d between the second electrode 22 and the light emitting layer 16 is 4 μm.

The obtained light emitting element 1 was used for (1) measurement of I-V characteristics and (2) lighting experiments.

(1) Measurement of I-V Characteristics

Figure 5:
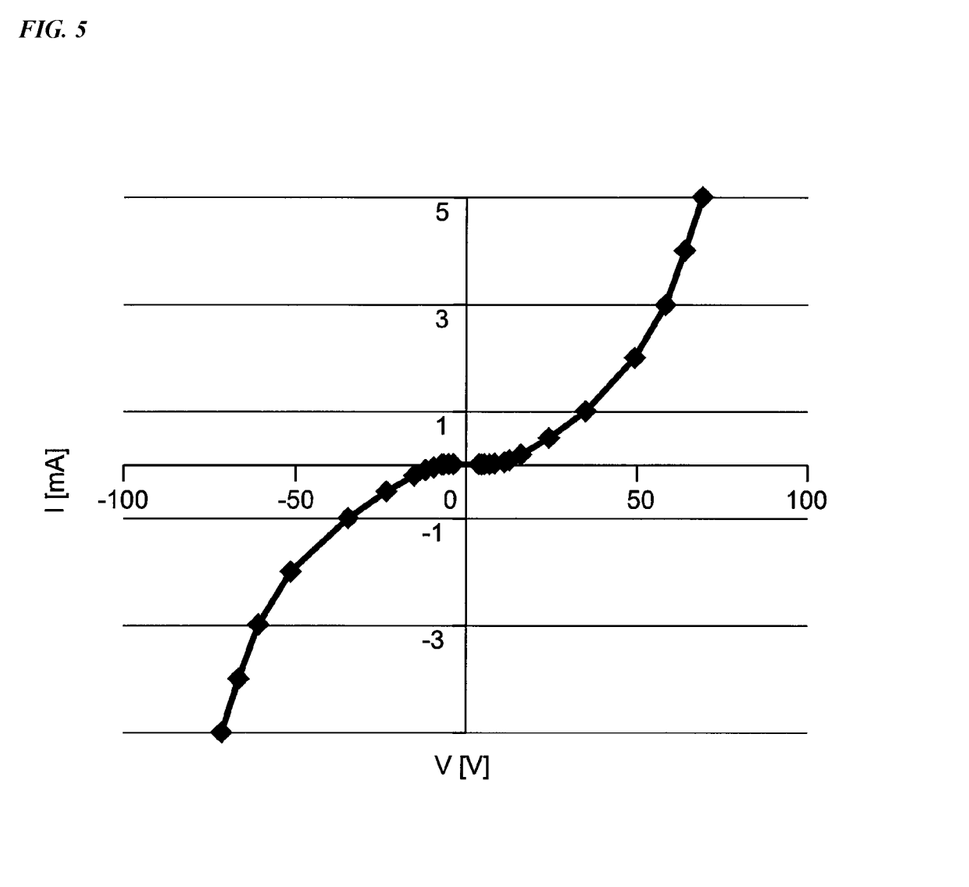
FIG. 5 is a graph showing the I-V characteristics of the light emitting element fabricated in Example.

The I-V characteristics (current-voltage characteristics) of the light emitting element 1 were measured by applying an electric current between the first electrode 21 and the second electrode 22 of the light emitting element 1. The measurement results are shown in FIG. 5. In FIG. 5, when a voltage is applied from the first electrode 21 to the second electrode 22, values (voltages) on the horizontal axis of the graph are positive, whereas when a voltage is applied from the second electrode 22 to the first electrode 21, values (voltages) on the horizontal axis of the graph are negative.

As can be seen from FIG. 5, the light emitting element 1 does not exhibit the rectifying characteristics, such as that exhibited by the conventional LED, and shows the I-V curve that shows the point reflection in the origin. The rise voltage was approximately ±20 V.

(2) Lighting Experiments

Figure 6:
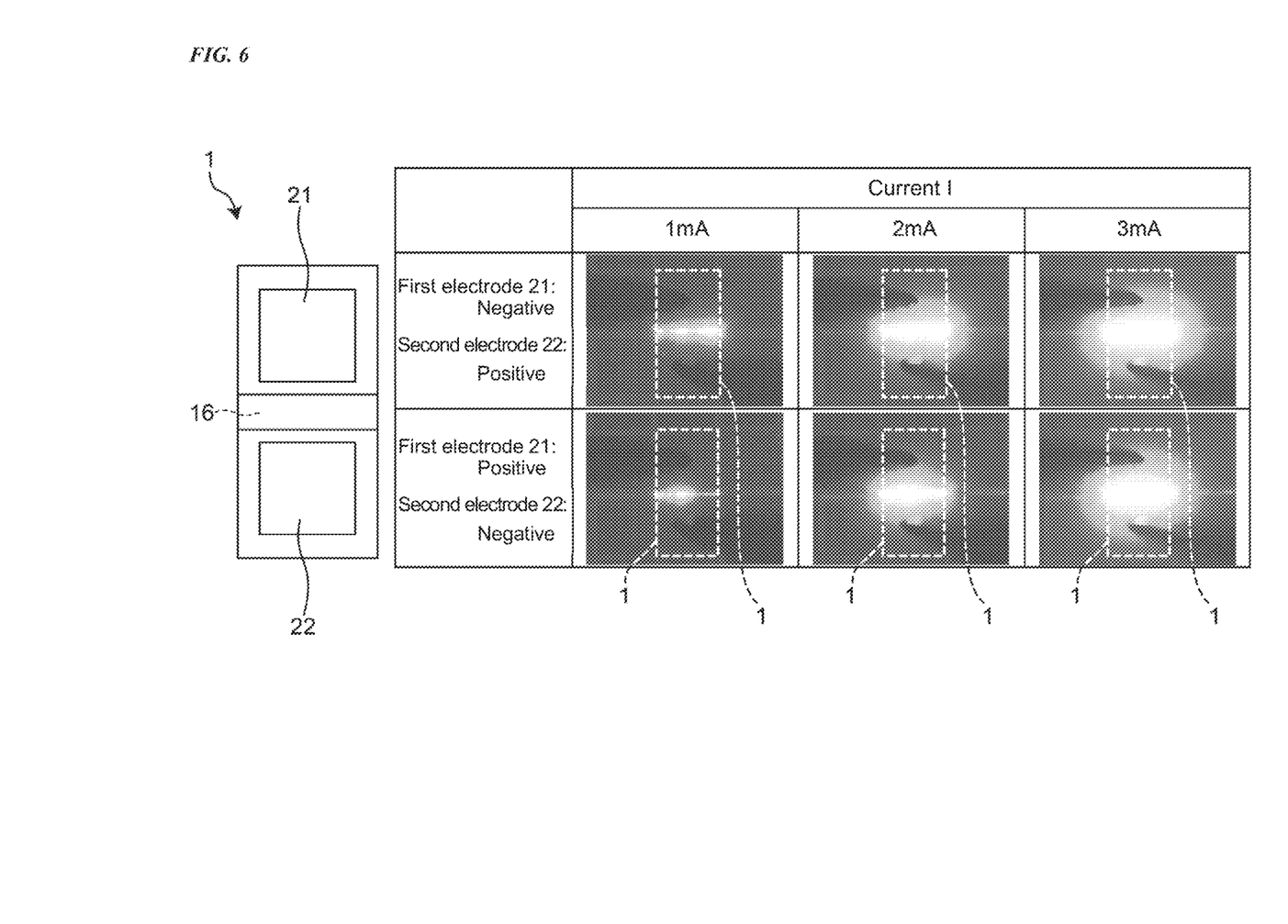
FIG. 6 shows photographs of the results of lighting experiments performed on the light emitting element fabricated in Example.

The light emitting element 1 was lit up by applying an electric current between the first electrode 21 and the second electrode 22 of the light emitting element 1. As shown in FIG. 6, for the current I of each of 1 mA, 2 mA and 3 mA, it was confirmed that the light emitting element 1 was lit up when applying the electric current with the first electrode 21 connected to the negative electrode of the external power source and the second electrode 22 connected to the positive electrode thereof, and also when applying the electric current with the first electrode 21 connected to the positive electrode of the external power source and the second electrode 22 connected to the negative terminal thereof.

From the results of the I-V characteristics and lighting experiments, it was confirmed that the light emitting element according to Example did not exhibit the rectifying characteristics. Thus, the light emitting element according to Example can emit light continuously by AC current.

What is claimed is:

1. A light emitting element comprising: a first conductivity type semiconductor layer;
a second conductivity type semiconductor layer disposed over the first conductivity type semiconductor layer;
a first electrode and a second electrode disposed over the second conductivity type semiconductor layer and spaced apart from each other; and
a light emitting layer disposed over the second conductivity type semiconductor layer and, in a top view, positioned between the first electrode and the second electrode;
wherein each of the first conductivity type semiconductor layer, the second conductivity type semiconductor layer, and the light emitting layer is made of a nitride semiconductor.

2. The light emitting element according to claim 1, further comprising:
a substrate; and
an undoped nitride semiconductor layer disposed over the substrate;
wherein the first conductivity type semiconductor layer is disposed over the undoped nitride semiconductor layer.

3. The light emitting element according to claim 1, wherein:
the first conductivity type semiconductor layer is a p-type nitride semiconductor layer; and
the second conductivity type semiconductor layer is an n-type nitride semiconductor layer.

4. The light emitting element according to claim 1, wherein a thickness of the second conductivity type semiconductor layer is in a range of 200 to 500 nm.

5. The light emitting element according to claim 1, wherein a thickness of the first conductivity type semiconductor layer is in a range of 0.1 to 1.5 μm.

6. The light emitting element according to claim 1, wherein each of a first distance between the first electrode and the light emitting layer and a second distance between the second electrode and the light emitting layer is in a range of 1 to 4 μm in the top view.

7. The light emitting element according to claim 1, wherein a dimension of the light emitting layer in a direction of separation between the first electrode and the second electrode is in a range of 1 to 30 μm.

8. The light emitting element according to claim 1, further comprising:
a cap layer formed of an undoped nitride semiconductor and disposed over the light emitting layer.

9. The light emitting element according to claim 1, further comprising:
a superlattice layer between the second conductivity type semiconductor layer and the light emitting layer.

10. A light emitting element comprising: a first conductivity type semiconductor layer;
a second conductivity type semiconductor layer disposed over the first conductivity type semiconductor layer;
a light emitting layer disposed over the second conductivity type semiconductor layer; and
a first electrode and a second electrode disposed on the second conductivity type semiconductor layer and spaced apart from each other;
wherein each of the first conductivity type semiconductor layer, the second conductivity type semiconductor layer, and the light emitting layer is made of a nitride semiconductor.

11. The light emitting element according to claim 10, wherein the first electrode and the second electrode are made of one or more materials selected from metals and conductive oxides.

12. The light emitting element according to claim 10, wherein the first conductivity type semiconductor layer is a Mg-doped GaN layer.

13. The light emitting element according to claim 10, wherein the second conductivity type semiconductor layer is a Si-doped GaN layer or an undoped GaN layer.

14. The light emitting element according to claim 10, further comprising:
   a substrate; and
   an undoped nitride semiconductor layer disposed over the substrate;
   wherein the first conductivity type semiconductor layer is disposed over the undoped nitride semiconductor layer.

15. The light emitting element according to claim 10, further comprising:
   a cap layer formed of an undoped nitride semiconductor and disposed over the light emitting layer.

16. The light emitting element according to claim 10, further comprising:
   a superlattice layer between the second conductivity type semiconductor layer and the light emitting layer.

17. The light emitting element according to claim 1, wherein the first electrode and the second electrode are in direct contact with the second conductivity type semiconductor layer.

18. The light emitting element according to claim 1, wherein the light emitting element does not exhibit rectifying characteristics.

19. The light emitting element according to claim 10, wherein the first electrode and the second electrode are in direct contact with the second conductivity type semiconductor layer.

20. The light emitting element according to claim 10, wherein the light emitting element does not exhibit rectifying characteristics.

* * * * *